2,704,512

METAL PRINTING PLATE AND METHOD OF PRODUCING SAME

William F. Alexander, Westpark, Ohio, assignor, by mesne assignments, to Claber Bi-Metal Plate Company, Inc., New York, N. Y., a corporation of New York No Drawing. Application December 12, 1951, Serial No. 261,360
6 Claims. (Cl. 101—401.1)

This invention relates to improvements in printing plates for relief or direct printing and the making of printing mats and more particularly to a printing plate of the composite type in which one metal is plated on another, and to a method for charactering a printing plate by etching.

Plates for use in the printing of newspapers, books and the like by direct printing methods, including processes which employ cast plates made from mats formed on original plates, are conventionally made of metal such as copper or zinc the surface of which is etched to produce in relief the picture or other desired printing characters. It has previously been proposed to substitute plates of magnesium and other light metals for zinc and copper and it has also been proposed to provide surface coatings of metals such as copper on base plates of zinc, iron, and the like. But such plates have not been entirely satisfactory for use in the photoengraving processes. Both zinc and copper plates are relatively heavy and are costly. Compared to the plate of the present invention they require a relatively long time in processing.

In the making of an etched relief printing plate as by conventional photoengraving process, the printing plate is first polished or provided with a smooth surface by rubbing with pumice. A sensitized layer or film is then formed on the polished surface as by pouring or flowing on the usual sensitive film forming solution which is allowed to dry in air. Desirably the plate, carrying the poured on sensitizing solution (known as hot top or cold top) is rotated in an inverted position (wet side down) during the drying to distribute the solution uniformly over the surface and to discharge any excess centrifugally to provide on the smooth plate surface a thin uniform sensitized film. The sensitized film on the plate is then exposed through the desired negative to the energy of an arc lamp or other source of light. Thereafter the exposed sensitized surface is developed as by immersion of the entire plate in the usual alcohol dye solution, after which the plate is washed and dried.

This exposure and development of the sensitized film on the polished surface of the plate gives surface characteristics in which those portions of the plate representing nonprinting areas are exposed or bare and those surface portions that are to print are protected by the dyed film remaining after developing. The usual etching in nitric acid then brings the plate into relief by eating away those portions of the plate surface that are unprotected by the dyed film and are thus exposed to the action of the acid.

It is not feasible, of course, to perform the etching by a single exposure of the plate to the etching acid for the desired length of time. This is for the reason that the etching acid attacks the metal in all directions, i. e., laterally as well as directly or normally into the central portion of the unprotected plate areas. Therefore, the etching acid or solution undermines or eats away the margins of the etched out areas unless the latter are protected. Loss of definition and reduced accuracy of reproduction result. It is customary, therefore, for the skilled photoengraver to perform the etching process in a series of steps and to protect the margins of the printing areas by suitable treatment between successive etching steps.

Between each etching step or "bite," according to the procedure heretofore known and commonly practiced in the photoengraving departments of newspapers and the like, the partially etched plate is treated with an etching powder or resin traditionally called "dragon's blood." In the treatment of the plate with the etching powder the latter is dusted on the plate and brushed off in one direction with or without an accompanying tilting of the plate in the same direction so as to locate the etching powder against the shallow side walls bordering the etched areas. By heating the plate on a gas burner with the etching powder so positioned the latter is fused or "burned in" to remain in protective relation along the edges of the etched areas. To protect all of the walls of the etched areas where the latter join the printing or unetched areas, it is customary to dust on the etching powder and brush it off in several directions in a series of "burning in" treatments. Thus the multiple step etching process, involving as it does the protection of the marginal definition of the printing areas by the etching powder before each etching step, becomes a time consuming process.

It is, therefore, one of the principal objects of the present invention to provide an improved plate for use in the making of a direct or relief printing plate as by the photoengraving process, the new plate principally consisting of relatively light weight metal available in quantity and at a relatively low cost. More specifically it is sought to provide a photoengraving printing plate comprising a metal base portion of magnesium or its alloys and a thin skin or surface portion of zinc.

In the provision of an improved plate of the character mentioned an endeavor is made to provide a plate that is adapted for use in established photoengraving techniques and that will be acceptable to technicians familiar with the processing of conventional plates. Existing equipment and personnel can thus be utilized without any need for buying special machines or training operators in strange new techniques.

As a corollary to the principal object of providing a generally improved printing plate it is sought to provide an improved plate etching process by use of the photoengraving technique, the improved process being conceived to take advantage of the physical characteristics of the new plate. In this new art or technique the making of a printing plate by the photoengraving process is considerably reduced in time. Advantage is taken of the difference in the rate that the etching liquid or acid attacks the magnesium body of the plate as compared to the rate at which it attacks the overlying skin or coating of zinc. Since the zinc is more resistant to the etching liquid than is the magnesium or magnesium alloy body the margins of the printing areas or images on the surface of the plate are relatively less subject to attack than the body and accordingly do not tend to recede to deform the image outline at an excessive rate during the etching process. Under such circumstances relatively less protection is required over the surfaces and along the marginal edges of the images or printing areas. Thus a deeper etching can be effected during each treatment in the acid bath or etching solution and the number of steps, "bites" or times that the plate is subjected to the etching process is reduced. Consequently the number of times that the plate must be treated with etching powder and the latter "burned in" is also reduced.

In accordance with the present invention, a printing plate is made up utilizing as the metal base portion or body member a commercial magnesium or magnesium alloy plate herein referred to as a "magnesium plate." Preferably the base plate portion is predominantly magnesium, being at least about 80 to 90 per cent or more magnesium by weight, the balance being the usual alloying constituents and impurities. It is recognized, however, that the advantages of the invention, or some of them, are obtained with a lesser amount of magnesium than mentioned above, satisfactory results being obtained when the magnesium is present to the extent of 51 per cent or more, by weight. A suitable magnesium alloy plate is made by The Dow Chemical Company of Midland, Michigan, for use in photoengraving processes. The principal constituent is magnesium.

The body plate is rolled or otherwise formed to a uniform thickness of from about .062 inch to about .065 inch. If the commercial magnesium plate available is of greater thickness than indicated it is satisfactory to reduce its thickness as by planing or shaving to bring it within the range of from about .062 inch to about .065 inch. Preferentially the body plate, when smoothed, cleaned and ready to receive the surface or skin coat as later described, has a finished thickness of the order of about .064 inch. This thickness is not critical except to the extent that the plate is to be used in standard printing frames, presses and the like, or is to be curved to the cylindrical contour of a rotary press and applied to a dummy cast for direct printing. A magnesium or magnesium alloy base plate having a thickness other than that specified is satisfactory for use in the present invention, it being understood that when using a plate of another thickness compensation is made in the wooden or other supporting block or dummy cast to which the engraving plate is attached for printing. Thicker plates are to be avoided when curving of the plate is contemplated because of the possibility of distorting the printing surface or characters.

One or both surfaces of the plate, after the latter has been trimmed or determined to be the desired size, are scoured and cleaned as by scrubbing and the use of suitable detergents to provide an uncontaminated surface for receiving a relatively thin zinc surface coat or skin. To apply the zinc skin conventional metal coating or plating processes are employed. The zinc skin protects the underlying magnesium or magnesium alloy of the base plate against attack by chemicals such as chlorides contained in the washing waters conventionally used in photoengraving shops. A plated-on skin applied by electrodeposition, especially when preceded by a preliminary treatment which results in a bonding or juncture layer between the zinc skin and the magnesium or magnesium alloy body, has additional advantages associated with the physical structure of the composite plate and also with the satin-like surface finish thus obtained. The electroplated skin is more receptive than conventional plate surfaces to the sensitizing or topping enamel and produces a more perfect printing plate substantially free of flaws and imperfections on the printing surface areas. A relatively thin zinc skin maintains a more secure bond or joint between the skin possibly because of the different thermal expansion coefficients of the two metals. The magnesium or magnesium alloy of the plate body is superior to the zinc of the skin in physical properties such as tensile strength, hardness and elongation. It is thus contemplated to make the zinc skin as thin as practically possible so as to take full advantage of the desirable qualities and characteristics of the magnesium and to maintain a strong juncture bond.

It has been found that the zinc skin, exclusive of any alloy or other bonding layer or juncture zone formed as by a preliminary bath or immersion treatment, is preferably of microscopic thickness. For coarse or deep etching and special applications such as in line work a skin thickness of as much as .003 inch is usable, but for general photoengraving purposes a zinc skin thickness of less than .0015 inch is sought, preferably being held to less than about .001 inch. Most satisfactory results are obtained with respect to handling, processing time, economy, physical properties, surface texture and permanence, and security of the bond betwen skin and plate body when the zinc skin has a substantially uniform thickness in the range of from about .0003 inch up to about .001 inch, a thickness of the order of about .0006 inch being most preferred. The thinner the engraving screen that is to be used with the plate, the thinner the zinc skin that can be used. For example, an engraving plate having an extremely thin zinc skin about .0003 inch thick, requiring special care in handling to avoid scratching and other marring and damaging as by abrading, can be used satisfactorily with a screen of about 120 or more lines per inch, such as used in high quality engravings for magazine printing, but would be less suitable for coarse screen engraving of about 60 lines or less per inch, such as used in newspaper advertising and similar line work. Conversely, the relatively thicker skinned plates, having a zinc surface about .001 inch or more thick, are most satisfactory for the coarse screen engraving. The thicker skins, more resistant to damage by scratching and abrading as in the scouring required to clean the surface preliminary to flowing on the sensitizing enamel, are thus preferred for the coarse screen engraving encountered in newspaper line work. Since the thicker zinc skins are generally more costly than the thin skins, especially when applied in the preferred manner by electrodeposition, it is desirable, from the standpoint of economy, to use the thinnest zinc skin that can be applied and that will withstand the handling and abrading normally encountered in the commercial engraving shops without failure or exposure of the underlying magnesium.

The composite zinc-clad magnesium plate of the present invention is preferably made, as mentioned above, by electrodeposition of the zinc surface coating on the magnesium or magnesium alloy base plate. The electroplating process employed may include a preliminary sand blast cleaning or surface treatment and other known steps such as the use of a pretreated zinc cyanide alkali bath whether the base plate be magnesium or one of the commercial magnesium alloys. Preliminary treatment of the plate, bath or electrolyte is known to foster the laying down of an alloy or other bonding zone in the composite plate at the juncture between the magnesium or magnesium alloy base plate and the zinc skin. The plating process may also provide as by heat treatment for the formation of an alloy or other bond between the zinc and the magnesium, and another metal or the salt of another metal such as cadmium may be included in the electrolyte so that the electrodeposited skin, while predominantly of zinc, may include small quantities of cadmium or similar metal as an alloying constituent. Such skins are included in the term "zinc skins" as used herein. In the case of a composite plate comprising a base of magnesium or magnesium alloy, a relatively light metal and a thin skin of zinc or zinc alloy, a relatively heavy metal, which plate also includes a bonding layer or zone the total thickness of the surface skin plus the bonding layer may slightly exceed the limits specified above, it being understood that the skin thicknesses set forth refer to the homogeneous skin, any bonding zone or layer not being included.

Electrodeposited zinc surface skins within the thickness range mentioned have been found to adhere to the base plate of magnesium, either directly or through a bonding layer sufficiently to permit the bimetal plate to be bent about a radius without separation of the metals or loss of the zinc skin. This feature is particularly advantageous in printing processes in which the engraved plate is curved for use as in conjunction with a dummy cast on the cylinder of a rotary press in a direct printing process. This bending of the printing plate of the present invention can be effected in either cold (room temperature) or heated condition.

Although much lighter than zinc, and therefore more easily handled, the composite zinc coated magnesium base plate of the present invention is stronger and has better physical properties and characteristics than conventional all-zinc plates, resulting in longer printing life and improved printing. These physical advantages not only provide a more practical and long-lived printing plate for use in direct printing processes but also provide a better original from which duplicate plates of improved character can be made by conventional processes.

In the case of a zinc skin or surface coat applied by or built up directly on the base plate as by flame spraying of the zinc it has been found desirable, as a preliminary treatment of the surface of the magnesium base plate, to subject the latter to a sand blast. In this treatment sand such as known in the trade as bonding sand is blown through a hand held nozzle by air under about 75 lb. per square inch gauge pressure, the magnesium plate being supported with the surface to be cleaned at about 10 to 20 inches from the nozzle. This sand blasting not only cleans the surface of the magnesium base plate but imparts to it a very finely roughened characteristic which is effective in obtaining a strong bond between the base plate and the sprayed-on zinc.

The spraying of the zinc skin or surface coat is done by feeding a wire or rod of zinc of about ⅛ inch diameter through the flame of an acetylene or other burning gas torch, the hot gases being directed or blown to carry the molten zinc in fine particles against the clean surface of the magnesium base plate where the impinging zinc is cooled and adheres to form a permanent bond with the magnesium body.

The zinc skin is built up on the magnesium plate to a thickness slightly in excess of the range mentioned above and is subsequently reduced in thickness to within the limits of the desired thickness range by planing, shaving or buffing. The thickness of the zinc can also be reduced to within the desired range by sanding using a power actuated sander such as an electric vibrator or an endless belt sander. In certain instances, as when the zinc skin is applied to a thickness only slightly in excess of the desired range, the finishing of the zinc surface is effected as by a hand held sander and hand polishing. A conventional cloth buffing wheel is suitable for polishing, the wheel being power rotated at a high speed of the order of 3600 R. P. M. and a suitable buffing compound or compounds being used such as pumice followed by jeweler's rouge.

The zinc surface layer or skin applied to the magnesium base plate by electroplating processes requires no finishing treatment and is thus preferred to the sprayed on zinc skin. No buffing or polishing is required and the zinc-clad magnesium or bimetal plate can be prepared for photoengraving by merely a light scouring with a water slurry of pumice using a brush and fine or 3F grit pumice, to clean the printing surface. A protective coating of a plastic or a resinous material is applied as by brushing or spraying to the rear or back surface of the bimetal plate to protect the magnesium during processing.

The composite zinc skinned magnesium plate is processed in a manner similar to, but much shorter, easier and with fewer critical factors than, that followed with conventional all-zinc plates in making a relief or direct printing plate. The zinc surface is cleaned as stated above by "pumicing up" to remove any dirt or contamination that may have collected thereon subsequent to the manufacturing or plating process. A sensitized film is then applied to the polished and cleaned zinc skin as by being flowed with enamel as referred to above. The present process and plate lend themselves to use with the usual enamels such as cold top bichromate, albumen (ink top), and hot top (glue top). While the sensitizing solution is drying the plate is supported horizontally in inverted position and is rotated or spun over a gas flame or other heater. Several minutes is required depending upon the dryness and temperature of the air. About two or three minutes in 70° air of about 50 to 80 per cent humidity usually suffices.

The bimetal printing plates of the present invention having electrodeposited zinc surface skins are superior to conventional all-zinc printing plates in that the enamel topping or sensitized film bonds to the electrodeposited zinc skin more uniformly and firmly and with less porosity than in the case of the conventional zinc plates. The sensitized enamel film or topping has been found to be denser or freer of surface imperfections such as pinholes and microscopic voids when applied to the electrodeposited zinc skin than when applied to the polished printing surface of a conventional zinc plate. The improved characteristics of the resin topping are believed related to the use of the electrodeposited zinc skin in the condition in which it is formed by the electroplating process and without subsequent sanding, buffing or polishing. The electroplated zinc has a satin-like texture or appearance and seems to be thoroughly wetted and covered by the flowed-on enamel, the latter exhibiting an affinity for the electroplated zinc which causes the enamel or topping to flow into or bridge microscopic voids or interstices of the electroplated zinc to give the desired uniform imperforate film coating. A conventional zinc plate having a highly polished printing surface produced as by sanding and buffing is much brighter and smoother to touch than the electrodeposited zinc skin surface of the present printing plate, it having been necessary or desirable to provide a mechanically smoothed or treated and mechanically polished surface on the rolled metal all-zinc plate to receive the topping or resin that constitutes the sensitized film.

The sensitized surface of plate is then printed or exposed as through a contact film negative having the desired picture or characters, a brilliant white light such as that from a carbon arc lamp being employed. In the usual fashion the sensitized and exposed surface is then developed, as by treating with an alcohol dye solution, washed and whirled dry.

Etching of the plate carrying the exposed and developed sensitized film is then effected by treatment with an etching fluid such as a nitric acid solution. A 42 per cent solution of nitric acid, further reduced by adding distilled water in the ratio of about eight parts of water to one of the acid solution is then passed over the surface of the plate. The use of an etching machine is desirable, the plate bieng supported in a generally vertical or upright position and the acid being thrown against the surface of the plate by rotating paddles.

After treatment with the acid for about 5 to about 20 seconds, depending upon the particular type of engraving being made—the relative extents of the exposed, unexposed and partially exposed plate areas—the plate is withdrawn from the etching machine, washed and dried. In this first etching step the areas of the zinc surface skin not protected by the resin film are etched or eaten away by the acid, exposing the underlying magnesium metal base plate. It is then dusted or powdered with etching resin or powder to line the margins of the etched out areas. Heating the plate fuses the etching powder, the latter being thus "burned in" so that, upon cooling, it adheres to the walls of the etched out areas. The "burned in" etching powder forms a protective resinous coating over the edges of the remaining zinc-clad printing areas, the protective coating extending over the line of connection or juncture between the zinc skin and the underlying magnesium base metal plate.

The partially etched plate, protected as it is along the margins of the printing areas by the fused resin or etching powder, is again subjected to the action of the nitric acid solution or other etching liquid in a manner similar to that described above. This second etching or acid exposure is longer than the first being from about 40 seconds to about a minute and a half. The duration of the second treatment will depend, of course, upon the character of the photographic material being engraved and also on the character and extent of the protective coating or resin film resulting from the preceding etching powder treatment. After this second "bite" or acid treatment which attacks or eats away the exposed areas of the magnesium base plate but does not substantially attack the resin protected zinc printing areas or the juncture line between zinc skin and underlying base metal, the plate is again washed and dried. It is then again treated by powdering with the etching powder or resin and the latter is "burned in." A third treatment by the etching liquid or acid solution in the etching machine then follows, this third treatment being longer than the preceding treatments and lasting from two to four minutes depending, again, on the character of the photograph or figure being engraved and the protective film provided by the fused etching powder resin.

When deep etching of the plate is desired, as in line work, the plate may be subjected to a fourth and possibly a fifth or sixth etching treatment each usually of longer duration than the preceding, the exact length depending upon the protection afforded by the fused etching powder and the character of the photograph or other object being engraved. Between the etching liquid or acid bath treatments, the plate is washed, dried and "powdered" with the etching powder, and the latter is fused in place or "burned in" in the usual manner. For printing plates used, say, in newspaper advertising it is usually sufficient and adequate to effect the desired etch to a depth of about .03 inch to .045 inch in four stages, requiring but three treatments or dustings with the etching powder. An additional step or steps would be required for comparable results using conventional plates and processes.

In each of the "powdering" treatments preceding the several etching steps the etching powder is dusted across the printing face of the plate as by stroking with a camel hair brush to stack or accumulate the resin powder along the margins of the etched out areas and in the angle between the walls defining the printing areas and the floor or floors of the etched out areas. Burning in of the resin thus stacked or concentrated produces the desired wall protecting resin film along the printing area marginal walls including cove-like portions in the angles between the walls and the floor areas. As the etching proceeds and the etched out areas deepen, the base metal of magnesium or magnesium alloy is eaten away below the level of the resin cove provided by the etching powder treatment of the preceding step so that each "burned in" etching powder provides, in effect, new coves at a lower level or deeper in the magnesium base metal than the coves of the preceding etching powder treatments. The present invention is chiefly concerned, however, with the first etching powder treatment which provides the protective resin film across the juncture line or bonding zone between the zinc surface skin and the underlying magnesium base metal, the number of subsequent treatments of the plate with etching powder being determined by the depth of etch desired, but in general being fewer in number than required in etching a conventional zinc printing plate. In some cases only a single etching powder treatment is necessary, the desired depth of etch being obtained in two etching steps, one preceding and one following the formation of the protective resin film across the juncture of the zinc surface skin and the magnesium base metal.

The finished printing plate obtained by the above process, whether it be a half-tone engraving or a plate for line work reproduction, is ready for use. The action of the etching liquid or acid in the magnesium body portion of the plate is effective to obtain a deep etch within the desired limits of from about .03 inch to about .045 inch, preferably in the neighborhood of about .038 inch. This deep etching of the non-printing areas of the plate permits the plate to be used without subsequent machine routing or carving out the non-printing areas. In using conventional plates of zinc or copper-clad metal it is a necessary practice, after the several etching steps or stages which produce the printing areas and outlines, to work on the open or nonprinting areas of the plate with tools that remove the metal to a level sufficiently below the plane of the printing surface to insure that the nonprinting areas will remain out of contact with the paper surface during printing. It is apparent, therefore, that the present composite bimetal plate comprising the combination of a paper-thin zinc skin on a magnesium body effects a considerable saving in time and labor since the machining operation for removal of excess metal from the nonprinting areas is substantially entirely eliminated. Only a light touching up for removal of unetched protuberances and the like is required.

There is also a saving in etching solution or acid and in time in the etching or acid treatment step or series of steps for the reason that the magnesium is relatively more sensitive or subject to attack by the etching liquid than zinc. It cleans up well during the treatment in the acid bath requiring less hand work by the engraver. When the magnesium is exposed to the action of the acid in the nonprinting areas, the eating away of the magnesium metal of the body of the plate occurs at a relatively greater or faster rate than in the case of conventional plates. The thin zinc skin, relatively more resistant to the etching liquid or acid than the magnesium body portion of the plate, defines the configurations of the printing areas and, since the treatment of the exposed nonprinting magnesium areas by the etching liquid is effected at a relatively greater rate than in the case of a zinc body printing plate, the printing areas retain the desired shapes, outlines, and sizes more satisfactorily than conventional plates.

Printing plates of magnesium and magnesium alloys have been proposed but have not been received with favor by the photoengraving trade. A conventional magnesium or magnesium alloy plate requires special handling and treatment. Because of the sensitivity of magnesium to most tap waters, particularly those containing chlorides, special care must be exercised during processing to avoid long exposures of the magnesium surface to rinse water. With some tap waters a magnesium plate must be protected by immersion in or other use of an ammonium bichromate solution. In the developing of an exposed sensitized film on a magnesium plate the latter must be protected against contact with the metal parts of the developing tank. Care must also be exercised when processing an ordinary magnesium plate to use clean solutions, uncontaminated with zinc, not only in the developing of the sensitized film but in the acid etching. Weaker solutions of etching acid are also required in the processing of an all-magnesium plate than in the processing of the present zinc-clad magnesium or magnesium alloy, the zinc-clad plate being suitable for processing in the conventional solutions. These precautionary restrictions on the use of ordinary magnesium and magnesium alloy plates have retarded their acceptance and adoption. But the printing plate of the present invention, not subject to such restrictions on its use, can be processed in a shop which also processes conventional zinc plates, all without confusion, without any necessity for special tanks or etching apparatus, and yet at a relatively faster rate than the conventional zinc plates.

In accordance with the patent statutes the principles of the present invention may be utilized in various ways, numerous modifications and variations being contemplated, it being understood that the particular procedures and methods set forth are given merely for purposes of explanation and illustration without intending to limit the scope of the claims to the specific details and procedural steps disclosed.

What I claim and desire to secure by Letters Patent of the United States is:

1. The method of producing a relief-image metallic printing plate which comprises forming a skin of zinc of uniform thickness in the order of .003 inch to .0003 inch on a relatively thick magnesium base metal plate, forming an acid resistant non-metallic protective film coating on selected areas of the zinc surface skin and constituting a resist-image and leaving background areas of said surface unprotected, removing the skin of zinc from the unprotected areas, and subjecting the exposed portions of the base metal plate to acid action to etch away the base metal to the required depth and form a relief-printing image having a zinc skin on the printing surface thereof.

2. An etched printing plate for relief printing having a lightweight supporting foundation comprising a sheet of magnesium imparting to said plate high tensile strength, hardness and resistance to distortion, said sheet having a coating of zinc, said plate having relief printing elements extending above etched non-printing areas in said magnesium plate, said relief printing elements each having a distortion resistant magnesium body portion integral with and rising above the surface of the non-printing areas and having printing faces of said zinc coating forming an oxidation resistant layer of uniform thickness in the order of .003″ to about .0003″ bonded to said magnesium sheet and providing an oxidation resistant protection for said magnesium body portion of the printing element.

3. An etched printing plate for relief printing having a lightweight supporting foundation comprising a sheet of magnesium imparting to said plate high tensile strength, hardness and resistance to distortion, said sheet having a skin of zinc provided with a non-metallic resist image coating thereon, said plate having relief printing elements extending above etched non-printing areas in said magnesium plate and defined by said resist image coating, said relief printing elements each having a distortion resistant magnesium body portion integral with and rising above the surface of the non-printing areas and having printing faces of said skin having said resist image coating thereon, said skin consisting of an oxidation resistant layer of uniform thickness in the order of .003″ to about .0003″ bonded to said magnesium sheet whereby said printing faces are protected against oxidation in use, said resist image coating providing a protective coating for said printing faces.

4. A plate prepared for etching for relief printing use having a lightweight supporting foundation comprising a sheet of magnesium imparting to said plate high tensile strength, hardness and resistance to distortion, a metal layer bonded to said magnesium sheet and consisting of a continuous skin of zinc of uniform thickness, said thickness being in the order of .003″ to about .0003″, and non-metallic image-receiving etchant resistant coating on said zinc skin.

5. A plate prepared for etching for relief printing use having a lightweight supporting foundation comprising a sheet of magnesium imparting to said plate high tensile strength, hardness and resistance to distortion, a metal surface layer bonded to said magnesium sheet and consisting of a continuous coating of zinc of uniform thickness, said thickness being in the order of .003″ to about .0003″, and a non-metallic etchant resistant image on said coating of zinc providing a protective coating over the portions of the printing plate which form the printing elements when the plate is etched.

6. The method of making a relief printing plate which comprises the steps of bonding a thin metallic skin of zinc in the order of .003″ to about .0003″ to a foundation sheet of magnesium having high tensile strength, hardness and high resistance to distortion, applying a non-metallic protective film over the metallic zinc skin on the plate, treating the protective film to define printing areas and uncover non-printing areas of said zinc skin, treating the non-printing areas to remove the zinc skin therefrom leaving the zinc skin remaining over the printing areas, and etching the exposed non-printing areas of the magnesium plate to relief printing depths thereby producing relief printing elements having printing faces of said zinc skin on distortion resistant magnesium body portions integral with and rising above the non-printing areas.

References Cited in the file of this patent

UNITED STATES PATENTS

| | | |
|---|---|---|
| 740,352 | Arms | Sept. 29, 1903 |
| 1,079,035 | Tebbetts | Nov. 18, 1913 |
| 1,807,875 | Robinson | June 2, 1931 |
| 1,903,778 | Conroy | Apr. 18, 1933 |
| 1,975,818 | Work | Oct. 9, 1934 |
| 2,054,054 | Jarman | Sept. 8, 1936 |
| 2,206,290 | Meyer | July 2, 1940 |
| 2,428,318 | Nachtman | Sept. 30, 1947 |
| 2,437,612 | Osborg | Mar. 9, 1948 |
| 2,444,422 | Bradford | July 6, 1948 |
| 2,490,978 | Osterheld | Dec. 13, 1949 |
| 2,569,149 | Brennan | Sept. 25, 1951 |
| 2,607,983 | McBride | Aug. 26, 1952 |